May 6, 1952 E. W. HOUGHTON 2,595,662

AUTOMATIC VOLUME CONTROL FOR OSCILLATORS

Filed Oct. 8, 1947 2 SHEETS—SHEET 1

INVENTOR
E. W. HOUGHTON
BY Franklin Mohr
ATTORNEY

May 6, 1952 E. W. HOUGHTON 2,595,662

AUTOMATIC VOLUME CONTROL FOR OSCILLATORS

Filed Oct. 8, 1947

2 SHEETS—SHEET 2

INVENTOR
E. W. HOUGHTON
BY Franklin Mohr
ATTORNEY

Patented May 6, 1952

2,595,662

UNITED STATES PATENT OFFICE 2,595,662

AUTOMATIC VOLUME CONTROL FOR OSCILLATORS

Edward W. Houghton, Chatham, N. J., assignor to Bell Telephone Laboratories, Incorporated, New York, N. Y., a corporation of New York Application October 8, 1947, Serial No. 778,611

6 Claims. (Cl. 250—36)

This invention relates to an automatic volume control for an oscillator and more particularly for an electronic oscillator such, for example, as a velocity variation oscillator, a reflex oscillator or a magnetron.

Oscillators like those of the types enumerated have in addition to the usual need for automatic volume control a special added need therefor due to the fact that such oscillators are generally susceptible to two kinds of controls, both of which affect the frequency of the oscillations generated and the volume of the power output. One type of control primarily affects the oscillation frequency, for example, as a tuning plunger inserted into a cavity resonator in the oscillator changes the volume of hollow space in the cavity resonator and hence the resonant frequency of the cavity and of the generated oscillations. Another type of control is represented by an electromotive force or potential applied to a control electrode of the oscillator, primarily affecting the volume of the power output but having a secondary effect upon the oscillation frequency. Oscillators of the types herein contemplated generally have more than one mode of oscillation, any of which modes requires for its maintenance that the control electrode potential remain within a restricted range of values. Manipulation of a tuning plunger in a cavity resonator associated with the oscillator is found to cause a shifting of the potential range within which a particular mode of oscillation is possible. Because of the interrelated effects of the two controls, difficulty is encountered when it is desired to change the oscillation frequency quickly and conveniently. If a change is made in the adjustment of the tuning plunger a corresponding adjustment is required in the control potential, resulting in a further small frequency change which may be corrected by a second adjustment of the primary frequency control, and so on, the tuning of the oscillator being a process of trial and error when the two controls are operated manually.

The automatic volume control in accordance with the invention not only serves the usual purposes of automatic volume control but also may be incorporated into one of the above enumerated kinds of controls, most advantageously the control which primarily affects the volume of power output. As a result the remaining control may be employed to set the frequency of the oscillator in a single operation, thereby avoiding the cut and try approximations above described. The automatic volume control operates to correct the control electrode potential to maintain a substantially constant volume of power output while an adjustment is being made in the primary frequency control and during any other condition which would otherwise cause the power output to vary.

The invention is more fully described hereinafter in connection with the appended drawings and the scope of the invention is defined in the claims.

Figure 1:
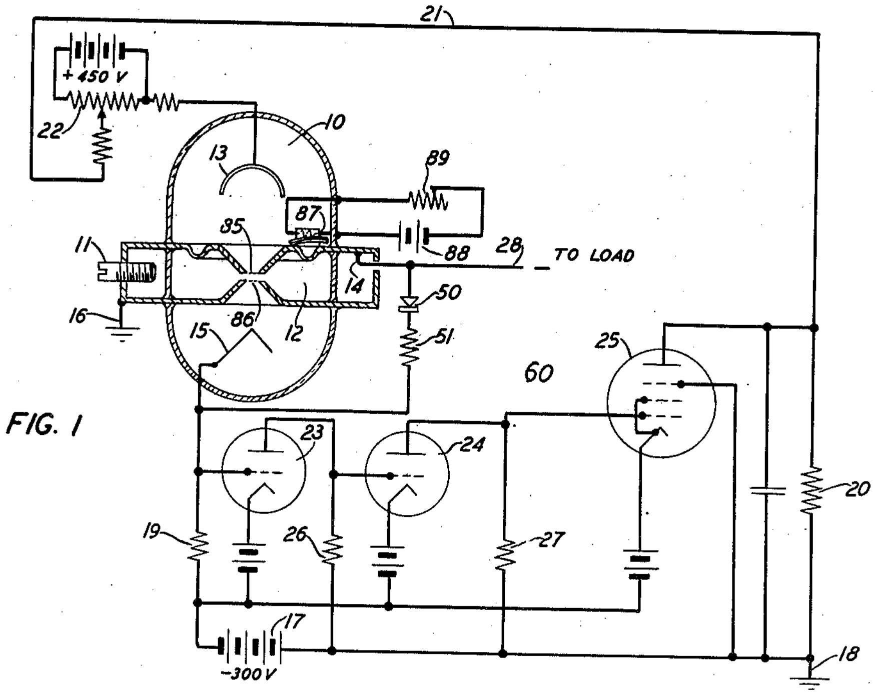
Fig. 1 is a schematic circuit diagram showing the invention embodied in a control system for an electron velocity variation oscillator of the reflex type arranged for continuous operation.

Referring to Fig. 1, there is shown a reflex oscillator 10 having a tuning screw 11, a cavity resonator 12, a control electrode or repeller 13, an output coupling loop 14 and a cathode 15. The cavity resonator 12 is grounded at 16 and is apertured to accommodate electrons passing from the cathode 15 through the resonator and on toward the control electrode 13. The apertures in the resonator may have grids 85 and 86. An accelerating battery 17 is connected with its negative terminal to the cathode 15 and its positive terminal to the cavity resonator 12 by way of the ground 16 and a similar ground connection 18. The cathode 15 is connected to the control electrode 13 through a cathode resistor 19, the battery 17, a load resistor 20, a lead 21 and a potentiometer 22. Between the cathode resistor 19 and the load resistor 20 there is also connected a three-stage direct current amplifier 60 comprising triodes 23 and 24 and a pentode 25. The battery 17 has the positive terminal thereof connected to the anode of the pentode 25 through the load resistor 20. The positive terminal of the battery 17 is also connected to the respective anodes of the triodes 23 and 24 through load resistors 26 and 27. The output coupling loop 14 is connected to any desired load through a conductor 28. For use in testing the system of Fig. 1, a rectifier 50 and a resistor 51 may be provided in shunt with the load.

In the operation of the system of Fig. 1, a suitable operating potential herein shown by way of illustration as 300 volts is impressed between the cathode and the cavity resonator of the oscillator 10 by the battery 17. Whether or not the application of this potential to the oscillator will produce sustained oscillations depends upon the potential of the repeller electrode 13 with respect to the cathode 15 as is well known in the art of reflex oscillators. The relationship between the control electrode voltage and the amplitude of oscillations is conveniently explained with reference to Fig. 2 in which the abscissae are control electrode voltages with reference to the cathode 15 and the ordinates are amplitudes. The solid line loops 30, 31 and 32 represent values of potential drop across the cathode resistor 19 in three respective ranges of control electrode voltage within which oscillations in three respective modes occur in the reflex oscillator 10. The dotted loops 33, 34 and 35 represent current outputs in the same three control electrode voltage ranges. The current outputs represented by these loops are rectified currents obtainable at the output of the rectifier 50.

Figure 2:
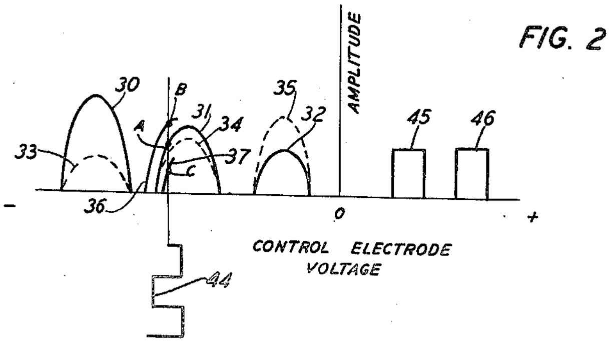
Fig. 2 is a graph useful in explaining the operation of systems embodying the invention.

Let it be supposed that the system of Fig. 1 is initially adjusted to operate with a control electrode voltage which defines the operating point A on the curve 31 of Fig. 2. The ordinate of the point A represents the change in amplitude of the direct current flowing in the cathode resistor 19 during oscillations. The potential drop across the resistor 19 acting through the direct current amplifier 60 produces a current in the load resistor 20 which fixes the potential drop across the resistor 20 and this potential drop in conjunction with the battery 17 and the potentiometer 22 determines a particular potential upon the control electrode 13, which is exactly the value required to produce oscillations in the oscillator 10 which oscillations in turn produce the assumed value of current through the resistor 19 for operating point A.

Assume now that the tuning screw 11 is adjusted slightly in one direction or the other to change the volume of the hollow space in the cavity resonator 12 and thereby to change its resonant frequency. To maintain the oscillations at a new frequency will require that the control electrode voltage be within a certain range of values which is a slightly different range from that required for the original frequency. This requirement results in effect in shifting the loop 31 either to the left or to the right along the axis of control electrode voltage. If the control electrode voltage is not changed, and the loop 31 is shifted to the left to a new position shown in part at 36, the new operating point is at B, representing a larger power output than before. If, on the other hand, the loop 31 is shifted to the right to a position shown in part at 37, the new operating point is at C, representing a smaller power output. Considering first a shift to the operating point B, there is an increased current in the resistor 19 causing the grid of the triode 23 to become more positive with respect to its cathode. More current is drawn by the triode 23, resulting in a larger potential drop in the load resistor 26 and a lowering of the potential of the anode of triode 23 and of the grid of triode 24. The triode 24 then draws less current resulting in a raising of the potential of its anode and that of the grid of the pentode 25. The pentode 25 then draws more current, causing a larger potential drop in the load resistor 20 and consequently increasing the amount of negative potential impressed upon the control electrode 13. The result is a shift of the operating point along the curve 36 from the point B toward a value of output equal to that at the original point of operation A. If it be assumed instead that the tuning screw was turned in the opposite direction, namely to cause the system to shift to the operating point C, less current flows in the resistor 19 resulting in less current in the resistor 20 and a shift of the control electrode voltage to a more positive, or less negative value, thereby tending to return the operating voltage to its original value and thereby restore the original power output.

The direct current amplifier 60 may be of conventional design and the number of stages may be increased or decreased as desired, except that an odd number or an even number of stages, as the case may be, will be required to produce the proper polarity of current change in resistor 20 to effect the control function. In the circuit shown and working on the left side of loop 31, an odd number of stages is required.

The over-all effect of the invention is to enable the operator to adjust the frequency of the system as desired, merely by adjusting the tuning screw 11, without thereby appreciably disturbing the power output. The system automatically restores the power output to the original value whenever the tuning screw 11 is readjusted.

Figure 3:
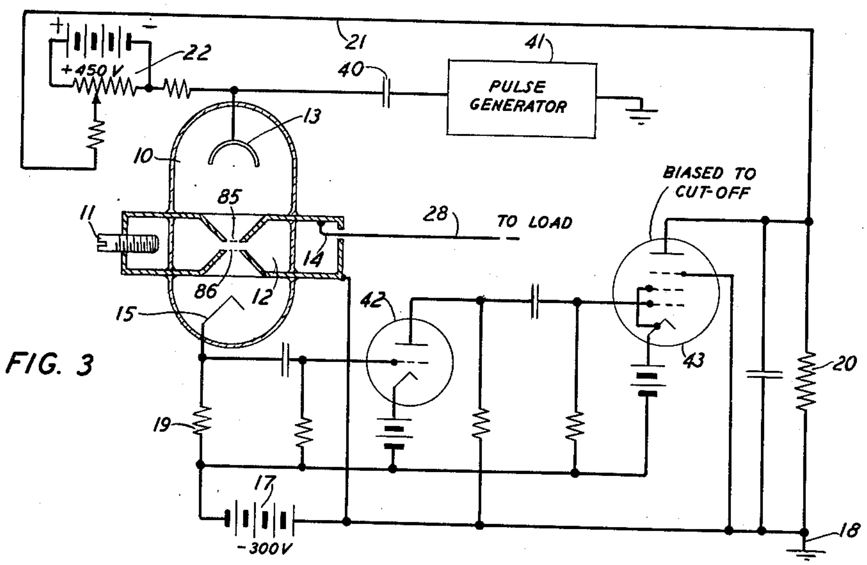
Fig. 3 is a schematic circuit diagram showing a control system which is a modification of that shown in Fig. 1, for use in pulse excited intermittent operation of the oscillator.

The arrangement shown in Fig. 3 is a modification of that shown in Fig. 1 and is particularly adapted to an arrangement in which the oscillator 10 is intermittently energized by pulses. There is connected to the control electrode 13 through a condenser 40 a pulse generator 41. The direct current amplifier employing the triodes 23 and 24 and the pentode 25 is replaced by a triode 42 comprising an alternating current amplifier and a pentode 43 comprising a rectifier, the control grid of the pentode 13 being biased to cut-off.

In the operation of the arrangement of Fig. 3, the initial adjustment is such that in the absence of a pulse from the pulse generator 41, the oscillator 10 does not oscillate. The control electrode potential is varied by pulses as indicated by the curve 44 in Fig. 2 to bring the oscillator periodically into the oscillating condition. Any desired value of duty cycle may be employed by adjusting the relative duration of the pulses, that is, the oscillator may be made to operate over any desired fraction of each cycle of the pulse generator. Operation of the oscillator produces a series of pulses through the cathode resistor 19 as represented by pulses 45 and 46 in Fig. 2. As in the operation of Fig. 1, if the tuning screw 11 is adjusted, the current through the resistor 19 is varied. In the operating condition B the pulses applied to the resistor 19 are of larger amplitude. These are amplified in the triode 42 and impressed upon the control grid of the rectifier 43, thereby increasing the amount of direct current in the resistor 20. The current in the resistor 20 is in such direction as to produce a negative increment of potential upon the control electrode 13. When this negative increment is increased by the application of the larger pulses in the resistor 19, the operating point of the system is shifted to a condition of more negative control electrode voltage, thereby tending to restore the system to the operating point A. Similarly, if the adjustment of the tuning screw 11 is in the direction of the operating point C, the control operates to restore the system again to the condition A.

Figure 4:
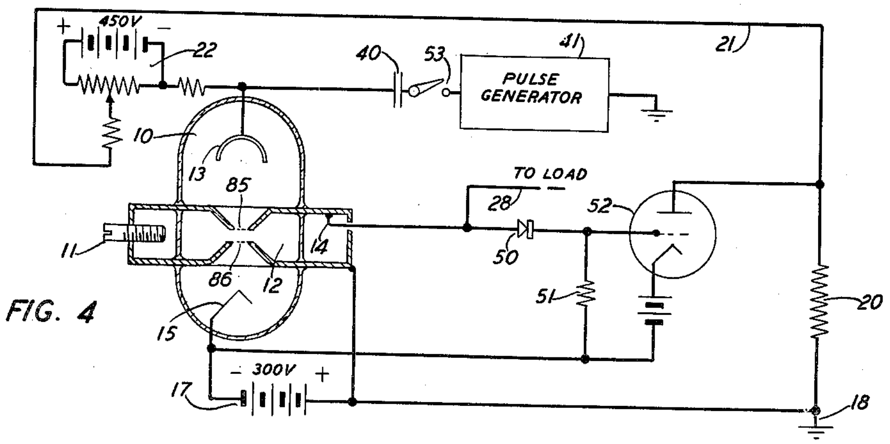
Fig. 4 is a similar diagram showing a variation of the control system of either Fig. 1 or Fig. 3.

In the arrangement of Fig. 4 the resistor 51 is connected between the control grid and the cathode of a direct current amplifier tube 52. The pulse generator 41 may be used or not as desired and may be connected into the circuit by means of a switch 53. The tube 52 is connected to the load resistor 20.

In the operation of the system of Fig. 4, some of the oscillation output of the cavity resonator 12 is shunted through the rectifier 50 and the resistor 51 to produce a potential difference between the grid and cathode of the tube 52 and thus to control the current through the load resistor 20. The system is adjusted to an operating point A as in the case of the systems of Figs. 1 and 3. If the tuning screw 11 is adjusted in such a way as to increase the power output of the cavity resonator 12, the potential applied to the grid of the tube 52 is increased and more current is sent through the resistor 20 thereby increasing the negative voltage upon the control electrode 13 and correcting the system to carry it back toward the operating condition A. Similarly, if the output of the cavity resonator 12 is decreased by adjusting the tuning screw 11, the current through the resistor 20 is decreased and the control electrode is made more positive, thereby tending as before to restore the system to the original operating condition. Due to the use of a rectifier and the absence of an alternating current amplifier, the control system will work either with pulse excitation, as when the switch 53 is closed, or with continuous operation as when the switch 53 is open. In the latter case, the initial potential upon the electrode 13 is adjusted to give the operating condition A.

Figure 5:
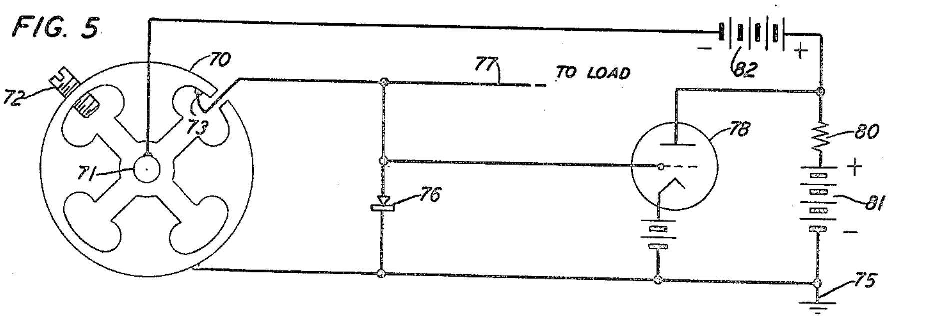
Fig. 5 is another similar diagram showing an embodiment of the invention in a control system for a magnetron oscillator.

Fig. 5 shows an embodiment of the invention as applied to a magnetron. The anode block of the magnetron is represented at 70, with a centrally located cathode 71. A tuning screw 72 is shown projecting into one of the cavity resonators in the block 70 and an output coupling loop 73 is shown in another of the cavity resonators. The anode block is grounded at 75 and a crystal rectifier 76 is inserted between the loop 73 and ground 75. The loop 73 has a connection 77 leading to any suitable load circuit. Across the terminals of the rectifier 76 there is connected the grid cathode circuit of a direct current amplifier triode 78. In the anode circuit of the triode 78 there are included a load resistor 80 and an anode supply source 81 represented as a battery. Another supply source 82 of greater potential than 81 and of opposite polarity is connected between the anode of the triode 78 and the cathode 71 of the magnetron.

In the operation of the arrangement of Fig. 5, the resonant frequency of the magnetron anode 70 may be changed by adjusting the tuning screw 72. Any change thus effected will result in a change in the volume of power output generated by the magnetron. It is known that the power output of a magnetron will vary when the potential difference between the anode and cathode is varied. Accordingly, a change in power output from the magnetron due to an adjustment of the tuning screw 72 may be offset by changing the anode-cathode potential in the proper direction. The direction of this change may readily be found by trial. It will be assumed that an increase of anode-cathode voltage will increase the magnetron output power. The polarity of the rectifier 76 in Fig. 5 has been so chosen as to produce the desired automatic volume control action with the single stage of direct current amplification shown. An increase of magnetron power causes a more negative voltage to be impressed upon the grid of the triode 78 by the rectifier 76, which in turn produces a reduced current through the resistor 80. The resulting decreased potential drop in the resistor 80 causes a decrease in the negative potential impressed upon the cathode 71 of the magnetron with respect to ground, this negative potential comprising the excess of potential of battery 82 over that of battery 81 plus the potential drop in the resistor 80. The reduced negative potential upon the cathode 71, by the assumption made, reduces the power output of the magnetron, thereby tending to keep the power output constant. Similarly, a decrease of magnetron power due to tuning causes a less negative voltage to be impressed upon the grid of the triode 78 which in turn produces an increased current through the resistor 80 and an increase in the negative potential impressed upon the cathode 71, thereby increasing the power output of the magnetron to offset the decrease brought about by the tuning.

Many alternatives to the tuning screw 11 are known, such as plungers, sliding plates, etc., and there are other ways of tuning a cavity resonator by thermal and mechanical means that are well known in the art, as for example, deforming the walls of the cavity resonator by squeezing or bending, varying the spacing between cavity grids, etc. It is to be understood that any of these or other suitable tuning devices may be used instead of the tuning screw 11. The same sort of substitution may be made for the tuning screw 72.

As an example of an alternative tuning means there is shown in Fig. 1 a block 87 representing a thermo-mechanical control element 87 mechanically coupled to the resonator 12 to vary the spacing between the grids 85 and 86. The element 87 is in turn controlled by a heating current furnished by a battery 88 through a rheostat 89, which control devices 88 and 89 are located outside the envelope of the oscillator 10. By adjusting the rheostat 89 the element 87 may be controlled to vary the spacing between the grids 85 and 86, thereby varying the resonant frequency of the resonator 12.

What is claimed is:

1. A space discharge oscillator having a cathode, a repeller electrode, and an apertured cavity resonator positioned between said cathode and said repeller electrode for the transmission of electrons from said cathode through the apertures in said cavity resonator and on toward said repeller electrode, means to maintain said cavity resonator at a positive potential with respect to said cathode, means to maintain said repeller electrode at a less positive potential than said cavity resonator to return to said cavity resonator a substantial proportion of the electrons approaching said repeller electrode in proper phase to produce sustained oscillations in said cavity resonator, said potential being in a range of potentials for which the volume of power output generated undergoes relatively large variations in response to relatively small changes in the said potential, means coupled to said cavity resonator to obtain a control potential which varies in response to variations in the volume of power output generated in said cavity resonator, and means to impress said last-mentioned control potential upon said repeller electrode in the polarity required to offset the said variations in the volume of power output from said cavity resonator.

2. An oscillator having a cavity resonator therein and means for maintaining an electron stream in operative relationship to said cavity resonator, said oscillator having two control elements, the first of which control elements primarily affects the frequency of the oscillations and secondarily affects the volume of power output from the oscillator, and the second of which control elements primarily affects the volume of power output and secondarily affects the oscillation frequency, said second control element being operable by means of a potential applied thereto, means for biasing said second control element to a potential in a range of potentials for which the volume of power output generated undergoes relatively large variations in response to relatively small changes in the said potential, means connected to said oscillator for generating a control potential which varies in response to variations in the volume of power output from the oscillator, and means for impressing said last-mentioned control potential upon said second control element in the polarity that offsets the said variations in the volume of power output from the oscillator.

3. An oscillator having a cavity resonator therein and means for maintaining an electron stream in operative relationship to said cavity resonator, said oscillator having a primary frequency control member that is secondarily a volume control, said oscilaltor also having a primary volume control member that is secondarily a frequency control and is operable by means of a potential applied thereto, means for biasing said primary volume control member to a potential in a range of potentials for which the volume of power output generated by said oscillator undergoes relatively large variations in response to relatively small changes in the said potential, means connected to said oscillator for generating a potential variation which is a replica of the variation in the output volume of said oscillator, and means for applying said first-mentioned potential variation to said primary volume control member in the polarity required to reduce volume fluctuations in the output of said oscillator, whereby the output volume of said oscillator is rendered substantially independent of changes in the setting of said primary frequency control member.

4. An oscillator having a cavity resonator therein, mechanical means for changing the resonant frequency of said cavity resonator that is secondarily effective as a volume control, said oscillator also having a volume control electrode that is secondarily effective as a frequency control, means for biasing said volume control electrode to a potential in a range of potentials for which oscillations are generated by said oscillator and the volume of power output generated undergoes relatively large variations in response to relatively small changes in the said potential, a subsidiary circuit connected to said oscillator for producing a potential variation which is a replica of the variation in the output volume of said oscillator, and means for applying said first-mentioned potential variation to said volume control electrode in the polarity required to reduce volume fluctuations in the output of said oscillator, whereby the output volume of said oscillator is rendered substantially independent of changes in the setting of said mechanical means for changing the resonant frequency of said cavity resonator.

5. An oscillator having a cavity resonator therein, mechanically or thermally variable tuning means for varying a physical dimension of said cavity resonator, said cavity resonator having a pair of apertures for accommodating an electron beam, an electron beam source mounted adjacent to said cavity resonator, means for projecting the electron beam from said source through and beyond said cavity resonator by way of the said apertures, an electron repelling electrode mounted in the path of said electron beam on the side of said cavity resonator opposite said electron beam source, means for biasing said electron repelling electrode to a potential in a range of potentials for which oscillations occur and for which the volume of power output generated by said oscillator undergoes relatively large variations in response to relatively small changes in the said potential, means connected to said oscillator for producing a potential variation which is a replica of whatever variation occurs in the volume of power output from said oscillator, and means for impressing the said first-mentioned potential variation to said electron repelling electrode in the polarity required to reduce the said variations in volume of output power from said oscillator.

6. An oscillator having a cavity resonator therein, a tuning member projecting into the interior of said cavity resonator, a mechanical tuning control device for adjusting the distance which the said tuning member projects into the cavity resonator, said cavity resonator having a pair of apertures for accommodating an electron beam, an electron beam source mounted adjacent to said cavity resonator, means for projecting the said electron beam through and beyond said cavity resonator by way of the said apertures therein, an electron repelling electrode mounted in the path of said electron beam on the side of said cavity resonator opposite said electron beam source, means for biasing said electron repelling electrode to an oscillation producing potential for which the volume of power output generated by said oscillator undergoes relatively large variations in response to relatively small changes in the said potential, means connected to said oscillator for producing a potential variation which is a replica of the variation in the output volume of said oscillator, and means for applying said first-mentioned potential variation to said electron repelling electrode in the polarity required to reduce volume fluctuations in the output of said oscillator, whereby the output volume of said oscillator is rendered substantially constant and independent of the position of the said tuning member.

EDWARD W. HOUGHTON.

REFERENCES CITED

The following references are of record in the file of this patent:

UNITED STATES PATENTS

| Number | Name | Date |
|---|---|---|
| 2,103,619 | Hallmark | Dec. 28, 1937 |
| 2,406,850 | Pierce | Sept. 3, 1946 |
| 2,475,074 | Bradley | July 5, 1949 |
| 2,493,011 | Miller | Jan. 3, 1950 |